US008719752B1

(12) United States Patent
Ye et al.

(10) Patent No.: US 8,719,752 B1
(45) Date of Patent: May 6, 2014

(54) HIERARCHICAL CROSSTALK NOISE ANALYSIS MODEL GENERATION

(71) Applicant: LSI Corporation, San Jose, CA (US)

(72) Inventors: Lun Ye, Allentown, PA (US); Edward C. Morgan, Macungie, PA (US)

(73) Assignee: LSI Corporation, San Jose, CA (US)

( * ) Notice: Subject to any disclaimer, the term of this patent is extended or adjusted under 35 U.S.C. 154(b) by 0 days.

(21) Appl. No.: 13/746,954

(22) Filed: Jan. 22, 2013

(51) Int. Cl.
*G06F 17/50* (2006.01)

(52) U.S. Cl.
USPC ............ 716/115; 716/102; 716/112; 716/136

(58) Field of Classification Search
USPC .................. 716/102, 112, 115, 136
See application file for complete search history.

(56) References Cited

U.S. PATENT DOCUMENTS

| | | | | |
|---|---|---|---|---|
| 5,469,445 | A * | 11/1995 | Nicolaidis | 714/726 |
| 6,449,753 | B1 | 9/2002 | Aingaran et al. | |
| 6,510,541 | B1 * | 1/2003 | Fujiwara et al. | 716/106 |
| 6,536,022 | B1 * | 3/2003 | Aingaran et al. | 716/115 |
| 6,594,805 | B1 * | 7/2003 | Tetelbaum et al. | 716/115 |
| 6,732,339 | B2 | 5/2004 | Savithri et al. | |
| 6,940,308 | B2 * | 9/2005 | Wong | 326/41 |
| 7,281,223 | B2 * | 10/2007 | Kiel et al. | 716/102 |
| 7,401,310 | B1 * | 7/2008 | Thaden et al. | 716/112 |
| 7,454,731 | B2 * | 11/2008 | Oh et al. | 716/113 |
| 7,886,257 | B2 * | 2/2011 | Yamaoka | 716/115 |
| 8,302,046 | B1 * | 10/2012 | Keller et al. | 716/108 |
| 2010/0057400 | A1 * | 3/2010 | Chou et al. | 702/182 |
| 2012/0011483 | A1 * | 1/2012 | Tetelbaum et al. | 716/113 |

OTHER PUBLICATIONS

Lundgren; "Behavioral Level Simulation Methods for Early Noise Coupling Quantification in Mixed-Signal Systems"; Mid Sweden University; 2005; pp. 1-72.*
R. Kanj et al., "Noise Characterization of Static CMOS Gates," 41st Design Automation Conference (DAC), Jul. 2004, pp. 888-893.
K.L. Shepard et al., "Harmony: Static Noise Analysis of Deep Submicron Digital Integrated Circuits," IEEE Transactions on Computer-Aided Design of Integrated Circuits and Systems, Aug. 1999, pp. 1132-1150, vol. 18, No. 8.
L. Ye et al., "Chip-Level Verification for Parasitic Coupling Effects in Deep-Submicron Digital Designs," Design, Automation and Test in Europe Conference and Exhibition, 1999, pp. 658-663.
K.-T. Cheng et al., "Test Challenges for Deep-Micron Technologies," Design Automation Conference (DAC), 2000, pp. 142-149.

* cited by examiner

*Primary Examiner* — Naum Levin
(74) *Attorney, Agent, or Firm* — Ryan, Mason & Lewis, LLP

(57) ABSTRACT

Techniques in integrated circuit design systems for generating one or more models for use in a hierarchical crosstalk noise analysis. For example, a method comprises the following steps. At least one equivalent cell noise model is generated for a circuit under modeling. The circuit under modeling comprises a plurality of cells useable in an integrated circuit design. The equivalent cell noise model is generated based on each one of the plurality of cells that have connections that terminate at ports of the circuit under modeling. The equivalent cell noise model is utilized in a hierarchical crosstalk noise analysis for the integrated circuit design.

20 Claims, 5 Drawing Sheets

```
proc \
lsiPtsiNoiseECN_supervisor { } args { } \
{~
    global lsiEcnRef2CellsA
    global lsiEcnCells2LibA
    set results(-cell_instance_name) " "
    set results(-use_as_library_cell) 0
    parse_proc_arguments -args $args results ... ... ...
    # No. 1 port: clk  direction: in  cell (block): supervisor
    set_noise_lib_pin [ get_pins -exact $xcn/clk ] $lsiEcnCells2LibA(CLKBUFX10SXP)/CLKBUFX10SXP/A

# No. 2 port: reset_n  direction: in  cell (block): supervisor
    set_noise_lib_pin [ get_pins -exact $xcn/reset_n ] $lsiEcnCells2LibA(BUFX6SXP)/BUFX6SXP/A

# No. 3 port: async_reset_n  direction: in  cell (block): supervisor
    set_noise_lib_pin [ get_pins -exact $xcn/async_reset_n ] $lsiEcnCells2LibA(BUFX6SXP)/BUFX6SXP/A ... ... ...
    # No. 1279 port: eeprom_sk  direction: in  cell (block): supervisor
    set_noise_lib_pin [ get_pins -exact $xcn/eeprom_sk ] $lsiEcnCells2LibA(CLKBUFX10SXP)/CLKBUFX10SXP/A

# No. 1280 port: eeprom_busy  direction: in  cell (block): supervisor
    Error: Nothing matched for -of_objects collection (SEL-005)
    Warning: this port is not connected to any leaf-level cell/pin!
        echo "done."
    ~}
    return
~}
define_proc_attributes \
    lsiPtsiNoiseECN_supervisor \
```

HIERARCHICAL CROSSTALK NOISE ANALYSIS MODEL GENERATION

FIELD

The present application relates to integrated circuit design.

BACKGROUND

In the design of integrated circuits, it is known that designers typically utilize one or more libraries of functional circuit elements, commonly known as "cells," to design circuits as part of one or more such integrated circuits. These cells are typically standardized in that they have known electrical characteristics such as, for example, propagation delay, capacitance and inductance. A System-on-a-Chip (SoC) is an integrated circuit in which the components needed for a particular system to operate are included on a single semiconductor-based device. Today's SoC designs continue to grow in complexity and performance as technology processes provide greater and greater densities. As such, designers are adopting block-based or hierarchical design methodologies to manage multimillion cell SoC designs, where a block comprises multiple cells that form a designated functional area of the integrated circuit design and/or a designated physical area of the integrated circuit device upon which the design is fabricated. The blocks are connected and/or interact in a design hierarchy. However, as blocks are designed, information about their implementation should be provided for integration of the respective blocks into the overall integrated circuit design. When design of the blocks is complete and the blocks meet their specific design criteria, an overall integrated circuit-level verification process is performed to validate the overall design prior to the tape out process. One part of such overall integrated circuit-level verification process includes performing a crosstalk noise analysis with respect to the hierarchy of blocks in the design, i.e., a hierarchical crosstalk noise analysis. There can be significant challenges in such analysis because there is a dependency between the noise behavior of a given block and the overall integrated circuit environment. As such, effective cell noise models should be generated to accurately account for such dependencies and other parameters.

SUMMARY

Embodiments of the invention provide techniques for use in integrated circuit design systems for generating one or more cell noise models for use in a hierarchical crosstalk noise analysis.

In one embodiment of the invention, a method comprises the following steps. At least one equivalent cell noise model is generated for a circuit under modeling. The circuit under modeling comprises a plurality of cells useable in an integrated circuit design. The equivalent cell noise model is generated based on each one of the plurality of cells that have connections that terminate at ports of the circuit under modeling. The equivalent cell noise model is utilized in a hierarchical crosstalk noise analysis for the integrated circuit design.

Alternative embodiments of the invention including, but not limited to, apparatus, integrated circuits and computer-readable storage media, provide other implementations of the hierarchical crosstalk noise analysis model generation described herein in order to improve the integrated circuit design process.

BRIEF DESCRIPTION OF THE DRAWINGS

FIG. 6 illustrates an equivalent cell noise model according to an embodiment of the invention.

DETAILED DESCRIPTION

Figure 1:
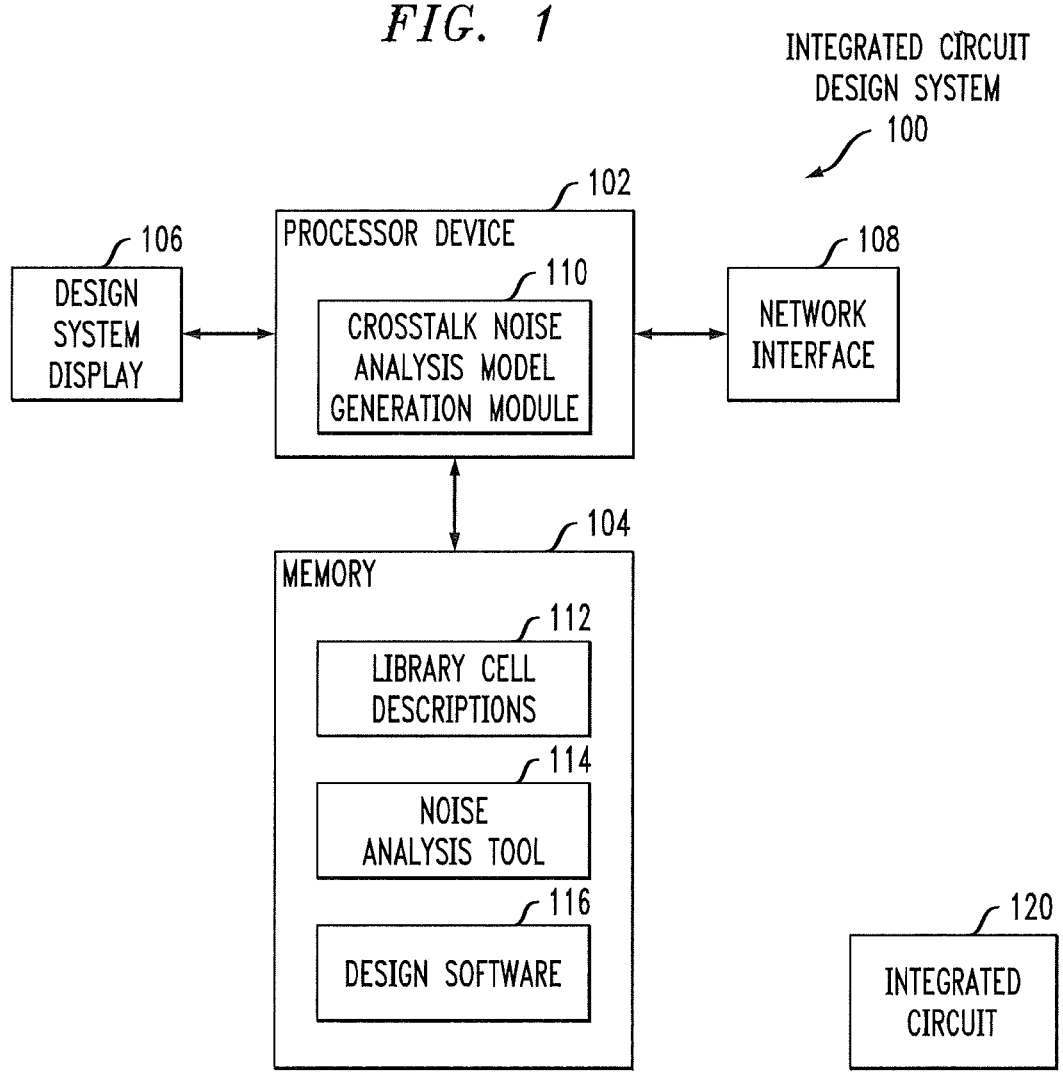
FIG. 1 is a diagram showing an integrated circuit design system with hierarchical crosstalk noise analysis model generation functionality according to an embodiment of the invention.

Embodiments of the invention will be illustrated herein in conjunction with exemplary integrated circuit design systems. It should be understood, however, that embodiments are more generally applicable to any integrated circuit design systems in which it would be desirable to generate one or more cell noise models for use in a hierarchical crosstalk noise analysis.

In the detailed description to follow, certain acronyms will be used. For convenience, below is a reference list of frequently used acronyms:

CCSN—Composite Current Source Noise
CUM—Circuit Under Modeling
ECN—Equivalent Cell Noise
I/O—Input/Output
IP—Intellectual Property
LC—Library Cell
SoC—System-on-a-Chip
UDN—User Defined Noise
VCW—Verification Wrapper Circuit Before describing illustrative embodiments of the invention, some drawbacks associated with existing cell noise model generation approaches will now be described.

As mentioned above, in the design of integrated circuits, designers typically utilize one or more libraries of cells to design circuits as part of one or more such integrated circuits. These libraries of cells are available to the designer via a computer system, commonly known as a "computer aided design" (CAD) system, and allow the designer to design circuits on a computer display screen simply by selecting particular library cells and placing them in a visual schematic representation of the proposed circuit on the display screen. The cells are a pre-characterized collection of logic gates such as, e.g., AND, OR, NAND, NOR, adders, inverters, etc. This allows the designer to design, with a reasonable degree of confidence, an integrated circuit that performs certain desired functions within specific operational constraints. Such standard cell design is thus able to achieve very high gate density while also achieving desired electrical performance.

As further mentioned above, SoC designs that have multiple blocks comprising multiple cells are typically subjected to a hierarchical crosstalk noise analysis. However, in such analysis, there is a dependency between the noise behavior of a given block and the overall integrated circuit environment. For example, identical blocks placed at different locations on the same integrated circuit can have different electrical behaviors due to noise coupling from external neighboring wires and over the routing of the respective blocks. Thus, for example, a noise glitch occurring in one block can adversely affect one or more other blocks. A noise glitch is an electrical pulse of short duration that is usually the result of a fault or error in the designed circuit.

To perform hierarchical crosstalk noise analysis during the integrated circuit design process, accurate noise models should be available for the various cells that make up a block. Noise models can be created by using commercial noise characterization tools such as Liberty NCX® (Synopsys, Inc. of Mountain View, Calif.) or SiliconSmart SI® (Silicon Metrics of Austin, Tex.) for core library cells to produce Composite Current Source Noise (CCSN) models. For memory cells and custom intellectual property (IP) cells and input/output (I/O) cells, a User Defined Noise (UDN) modeling approach can be employed. IP cells are custom-designed cells that are typically protected as intellectual property owned by a source entity. IP cells can be licensed from the source entity for use in integrated circuit devices designed by designers external to the source entity. For IP cells, such as cells available in the CoreWare® Subsystem (LSI Corporation of Milpitas, Calif.), crosstalk noise models can be created for hierarchical noise sign-off during the integrated circuit design process. However, it is impractical and inefficient to create CCSN or UDN models for IP cells and/or sub-blocks (where a sub-block is a portion of a block) of complicated integrated circuits, due to the cell size and cell structural complexity of these IP cells and/or sub-blocks.

By way of example only, for hierarchical integrated circuit design in 20 nanometer (nm), 28 nm and older/newer technologies, hierarchical noise analysis enhances the efficiency of IP cell development, block implementation, top-level implementation and noise-risk detection. Without hierarchical noise modeling and analysis, the IP cells and sub-blocks have to be implemented using a very pessimistic approach to ensure that the IP cell and/or sub-block used in a full integrated circuit context is reasonably clean in terms of crosstalk glitch noise.

A common noise modeling approach used for IP/sub-block noise analysis is to assume 40 percent of the integrated circuit power supply as the IP cell/sub-block input port noise threshold, and holding resistance at a fixed value as the output port driving model. These modeling approaches are typically pessimistic, resulting in over-designing of the IP cell/sub-block. These models can be optimistic as well, as has been determined by checking the cell noise characteristics using circuit simulations, resulting in IP cells/sub-blocks with crosstalk noise failure risks.

Another existing approach is to use gate timing models to derive crosstalk noise models. Since the transistor operation modes of a gate are quite different when in a timing analysis mode (when the gate is switching) as compared with a noise analysis mode (when the gate is at a static state), these models are not accurate when used in sign-off crosstalk noise analysis. The results can be either pessimistic or optimistic.

When performing hierarchical noise analysis without accurate and efficient noise models, such as in the existing approaches described above, a variety of drawbacks are encountered. For example, a significant amount of detailed circuit simulation run time and special noise modeling expert knowledge is needed to characterize noise models for IP cells. Further, with such existing noise modeling approaches, there are wasted glitch noise detection/fixing iterations, as well as wasted engineering time when performed so close in time to the tape-out process. Still further, the existing approaches result in overly pessimistic signal routing, wasted chip interconnect routing resources, and wasted implementation time. Local/global routing congestion due to false noise avoidance/fixing requirements are also results of the existing noise modeling approaches, as well as exaggerated cell upsizing which leads to enlarged IP cell size and excessive power consumption. The existing approaches also cause IP cell/SoC noise sign-off dependency that is only detectable too late in the integrated circuit design cycle, thus disrupting hierarchical design flow.

Embodiments of the invention overcome the above and other drawbacks. The IP cell/sub-block noise modeling and application approach described herein according to embodiments of the invention eliminates the need for a flat crosstalk noise analysis. The improved approach eliminates the need for detailed, circuit-level simulation noise characterization runs that are impractical for large IP cell/sub-blocks, while preserving accuracy for high-quality crosstalk noise analysis results in a hierarchical noise analysis flow. Using this improved approach, embodiments of the invention need not use specialized characterization tools or dedicated engineering resources to perform detailed noise model characterization for IP cell/sub-blocks for high-quality hierarchical noise analysis. Embodiments of the invention perform accurate crosstalk noise analysis to reduce the number of crosstalk noise analysis/fix iterations, saving engineering effort and time, especially when close to tape-out time (i.e., when noise fixing/sign-off is addressed). Cell/pin specific noise immunity models and accurate noise analysis drive models, created using embodiments of the invention, are used for crosstalk noise detection, reducing the demand on signal routing resources to avoid false crosstalk noise violations due to the use of inaccurate noise analysis models. Furthermore, embodiments of the invention use the accurate cell/pin specific noise immunity models generated to reduce routing congestions due to excessive routing resources demanded by false noise violations due to pessimistic noise models.

Still further, embodiments of the invention reduce the use of large-area cells that are required for false noise violation and victim driver sizing up (e.g., when a noise violation is detected, the "victim" cell is replaced with a more powerful version of the cell, i.e., higher driving strength, but with the same functionality), reducing IP cell area needed and power consumption due to the need to use larger cells caused by false noise violations. Embodiments of the invention are also used in a hierarchical integrated circuit design methodology, decoupling IP cell/sub-block level and top-level crosstalk noise analysis and noise sign-off, thus improving a designers' productivity.

Since application programs are and can be developed to implement the IP cell/sub-block noise model generation embodiments described herein using IP/sub-block information only, in a high-level design analysis such as when performing Static Timing Analysis, the noise models can be generated and verified by designers' with minimal or no noise model characterization knowledge, in minimal time (as compared to that needed to run noise model generation using circuit-level simulations by dedicated noise modeling experts). Note that commercially available tools that are used to perform Static Timing Analysis include, but are not limited to, Synopsis PrimeTime® (Synopsis Inc. of Mountain View, Calif.) and Cadence ETS® (Cadence Design Systems Inc. of San Jose, Calif.). As a result, the productivity of design engineers is improved, since understanding, executing and verifying noise model characterization by using detailed circuit-level simulations is beyond the knowledge scope of most, if not all, integrated circuit design engineers.

As will be explained in further detail below, crosstalk noise analysis and modeling techniques according to embodiments of the invention use an Equivalent Cell Noise (ECN) modeling strategy. The ECN modeling approach makes use of noise models already characterized for library cells, such as core cells, memory cells, custom IP cells or I/O cells. The input/output ports of an IP cell/sub-block are connected to leaf-level cells in standard libraries or other libraries. Using the ECN approach, the crosstalk noise analysis process uses a detailed accurate noise model for the IP cell/sub-block ports in a hierarchical analysis manner. The crosstalk noise analysis using the ECN approach is performed without the need to perform an equivalent quality analysis in a flat-analysis manner, maintaining crosstalk noise analysis result quality, yet without incurring the high cost of running flat crosstalk noise analysis.

It is to be understood that a "leaf-level cell" (or a library cell or a leaf-level library cell) is the basic (unit) circuit element contained in a standard cell library, such as, by way of example, an inverter, an adder, a buffer, a flip-flop, etc. When an integrated circuit is designed according to embodiments of the invention, the designer does not look inside a leaf-level cell, as they are already pre-designed and analyzed so they can be used later as a basic circuit-building block, saving implementation and analysis effort by abstracting away the transistor-level details. The designer only looks at the leaf-level cell boundary pins.

Further details of these steps and further embodiments thereof will now be illustratively explained in the context of FIGS. 1-6.

FIG. 1 is a diagram showing an integrated circuit design system with cell noise model generation functionality according to an embodiment of the invention. As shown, system 100 includes a processor device 102 coupled to a memory 104, and a display 106. The system 100 also includes a network interface 108 for permitting system 100 to communicate with other systems and devices over one or more networks. In one embodiment of the invention, network interface 108 comprises one or more transceivers.

The processor device 102 implements a crosstalk noise analysis model generation module 110 for generating one or more cell noise models for use in a hierarchical crosstalk noise analysis in an integrated circuit design in the manner disclosed herein. The processor device 102 also utilizes integrated circuit design software 116. Design software 116 includes other functions and operations of an integrated circuit design system which are not the focus of embodiments of the invention and thus are not further described herein. For example, other system design tools include, but are not limited to, a circuit simulation tool, a timing analysis tool, etc. Module 110 utilizes library cell descriptions (data/models) 112 and noise analysis tool (module) 114 in the crosstalk noise analysis model generation operations. The library cell descriptions (data/models) module 112, the noise analysis tool 114 and the design software module 116 are shown in FIG. 1 as being stored in memory 104. However, it is to be understood that parts or all of modules 112, 114 and 116 are loaded and executed by the processor 102 when needed.

Elements such as 110, 112, 114 and 116 are implemented at least in part in the form of software stored in memory 104 and processed by processor device 102. For example, the memory 104 may store program code that is executed by the processor device 102 to implement the crosstalk noise analysis model generation functionality of module 110 within an overall integrated circuit design process. The memory 104 is an example of what is more generally referred to herein as a computer-readable storage medium or other type of computer program product having computer program code embodied therein, and comprises, for example, electronic memory such as RAM or ROM, magnetic memory, optical memory, or other types of storage devices in any combination. The processor device 102 comprises a microprocessor, a central processing unit (CPU), an application specific integrated circuit (ASIC), a field programmable gate array (FPGA) or other type of processing device, as well as portions or combinations of such devices.

In general, crosstalk noise analysis model generation module 110 generates one or more cell noise models for a given library of cells (or subset thereof). After the one or more cell noise models are generated, they are used to perform a crosstalk noise analysis using noise analysis tool 114. Examples of a noise analysis tool include PrimeTime SI® (Synopsys, Inc. of Mountain View, Calif.) and Cadence ETS® (Cadence Design Systems Inc. of San Jose, Calif.), although alternative embodiments employ other suitable noise analysis systems. Operations of module 110 will be further described below in the context of FIGS. 2 through 6.

It is to be understood that, in other embodiments, the integrated circuit design system 100 in FIG. 1 also includes other systems, processes and/or operations (not expressly shown) for: generating one or more masks specific to the given integrated circuit design; and applying the one or more masks to a silicon die (wafer) during fabrication of the given integrated circuit. A result of the integrated circuit design processes performed by the system 100 is integrated circuit 120 shown in FIG. 1.

Figure 2:
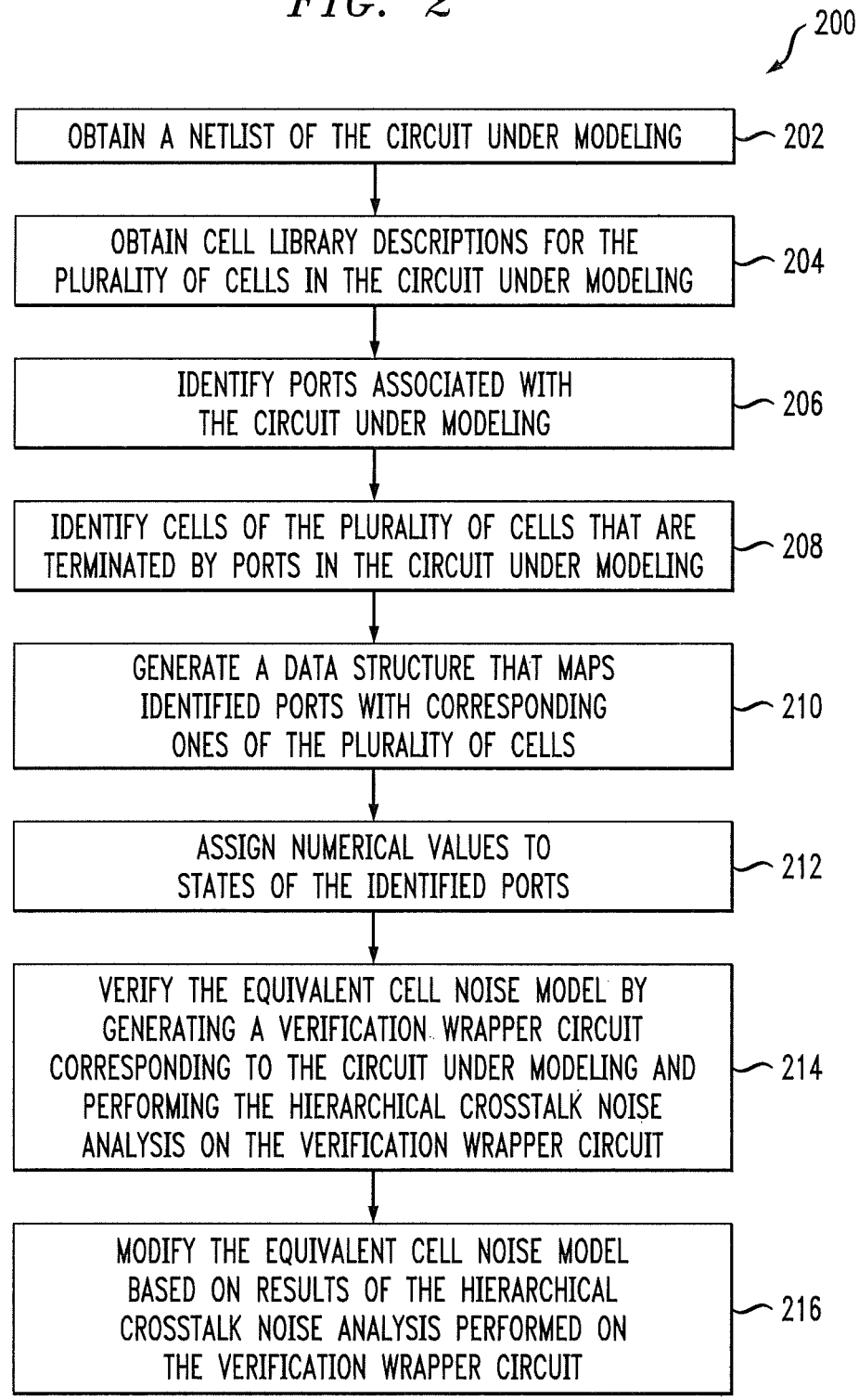
FIG. 2 is a diagram showing a hierarchical crosstalk noise analysis model generation methodology according to an embodiment of the invention.

FIG. 2 illustrates an embodiment of the invention that is a hierarchical crosstalk noise analysis model generation methodology 200. It is to be understood that methodology 200 is performed by module 110 in FIG. 1 in conjunction with processor device 102, memory 104, display 106, and network interface 108 (when needed or desired), as well as one or more other modules of design system 100 (when needed or desired). Further, once an ECN model is generated, steps of methodology 200 are executed by module 110 in conjunction with noise analysis tool 114 to perform a hierarchical crosstalk noise analysis. It is to be understood that while the methodology 200 of FIG. 2 describes steps of the hierarchical crosstalk noise analysis model generation process, examples and further details will be provided below in the context of FIGS. 3-6.

In step 202: the methodology 200 obtains a netlist of a circuit under modeling (CUM). The CUM is the circuit (e.g., part or all of the circuitry of the integrated circuit 120 being designed by the design system 100) for which one or more cell noise models are being generated.

In step 204, the methodology 200 obtains cell library descriptions for the plurality of cells in the CUM.

In step 206, ports associated with the CUM are identified.

In step 208, cells of the plurality of cells that are terminated by ports in the CUM are identified.

In step 210, the methodology 200 generates a data structure that maps identified ports with corresponding ones of the plurality of cells. In step 212, the methodology can alternatively assign numerical values to states of the identified ports. Thus, it is to be understood that for each individual port, step 210 mapping or step 212 assigning can be performed. Thus, looking at an ECN model for a block with multiple ports as a whole, the ECN model for that block can be (but does not have to be) a mixture of both step 210 mapping and step 212 assigning styles.

In step 214, the ECN model generated at the end of step 210 and/or step 212 is verified by generating a verification wrapper circuit corresponding to the CUM and a hierarchical crosstalk noise analysis is performed on the verification wrapper circuit. Generation of a verification wrapper circuit will be explained below in the context of FIGS. 3 through 6.

In step 216, the methodology 200 modifies the ECN model based on results of the hierarchical crosstalk noise analysis performed on the verification wrapper circuit.

As described above and illustrated in the context of methodology 200, there are two integrated phases in the ECN hierarchical crosstalk noise analysis flow. The first phase is to create the ECN models for IP cells/sub-blocks that are treated as hierarchical IP cells or sub-blocks used in the integrated circuit. The first phase is performed in steps 202 through 211. The second phase is to verify the IP cell/sub-block ECN models in a hierarchical crosstalk noise analysis flow. The second phase is performed in steps 214 and 216. Since the internal details of these IP cells or sub-blocks are not necessary and are not visible to the top-level noise analysis in a hierarchical analysis flow, the hierarchical crosstalk noise analysis approach described here according to embodiments of the invention achieves increased crosstalk noise analysis capacity and efficiency when compared to a flat crosstalk noise analysis approach, while maintaining high quality crosstalk noise analysis results by using detailed, accurate ECN noise models of the IP cells/sub-blocks.

A "flat" crosstalk noise analysis refers to the analysis style when the noise analysis considers the inside of an IP cell (or sub-block) to perform analysis on the cell instances and net instances that connect the cell instances inside the IP cell at the same time as analyzing the cell/net outside of that IP cell. That is, in a flat crosstalk noise analysis, all IP cells are replaced by the actual implementation of that cell, so the internal circuitry of the IP cell is exposed and is analyzed together with the circuit surrounding the IP cell. In contrast, embodiments of the invention treat the IP cell as a "leaf-level" library cell and do not look inside the cell, but rather stop at its boundary connections. This is a main benefit of the ECN model generated as described herein. That is, in hierarchical noise analysis, the ECN model allows the noise analysis tool to interact with the IP cell without analyzing the internal circuitry of the IP cell. This is a main reason for referring to a cell noise model generated according to embodiments of the invention as an "equivalent cell noise" model.

In an illustrative embodiment, the ECN model creation phase uses the circuit description (e.g., in Verilog format, Very High Speed Integrated Circuit (VHSIC) Hardware Description Language (VHDL) format, or some other HDL format) netlist of the IP cell/sub-blocks, referred to as the CUM, to be modeled. The input/output ports (pins) of the CUM are generally connected to core library cells, I/O cells, custom IP cells or memory cells that already have detailed noise model information in the form of CCSN, UDN, or even ECN format.

Figure 3:
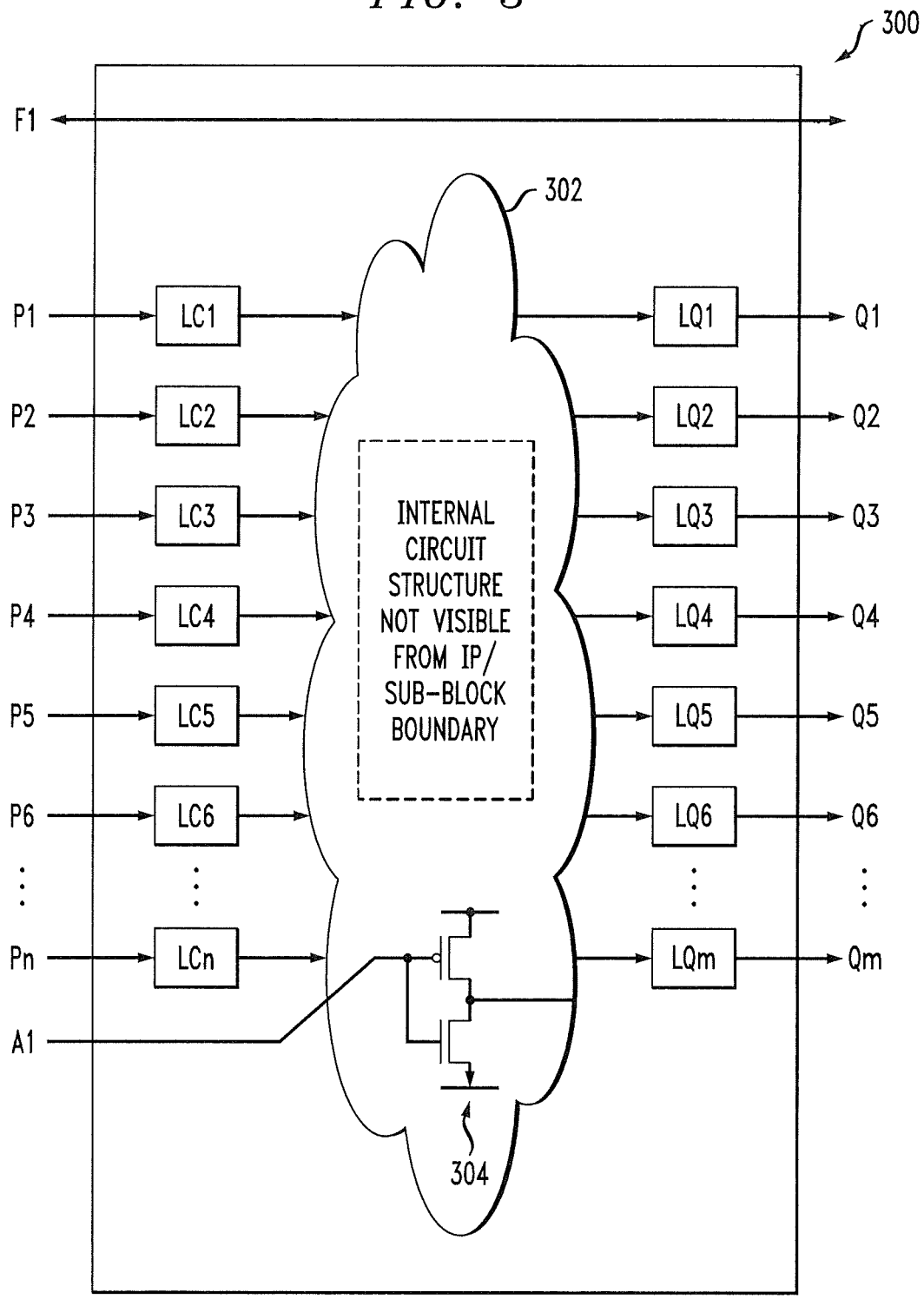
FIG. 3 is a diagram illustrating a circuit under modeling according to an embodiment of the invention.
Figure 4:
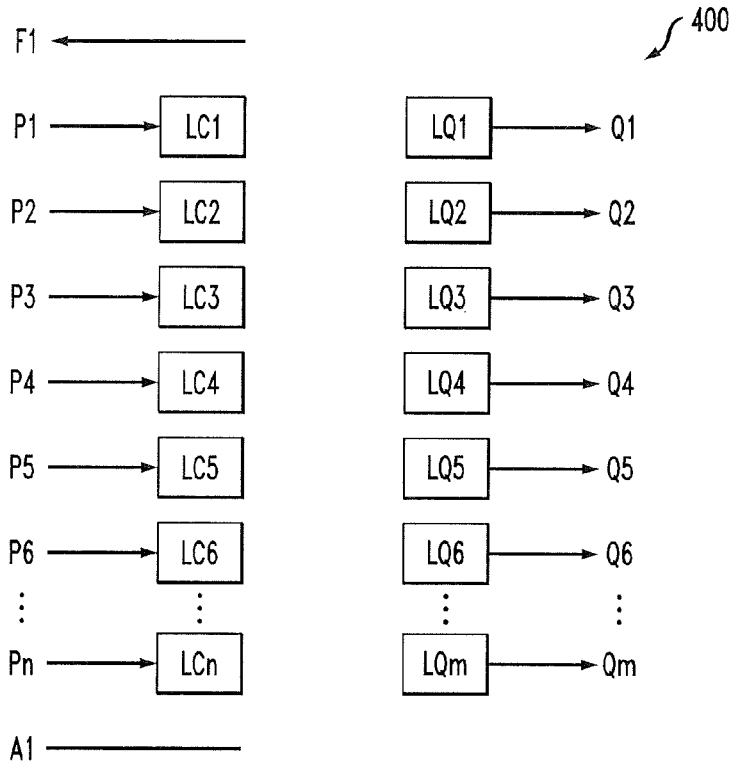
FIG. 4 illustrates an equivalent cell noise model circuit schematic view for the circuit under modeling of FIG. 3.

FIG. 3 is a diagram illustrating a CUM 300 according to an embodiment of the invention. The schematic view 400 of CUM 300 is shown in FIG. 4. It is assumed that CUM comprises multiple IP cells and/or sub-blocks.

As shown in FIG. 3, P1, ..., Pn denote input ports of the CUM 300, while Q1, ..., Qm denote the output ports of the CUM 300. F1 is an example feed-through port, and A1 is an example analog port connected to some (generically-illustrated) analog circuitry 304 in the CUM 300. LC1, ..., LCn denote library cells C1 to Cn. LQ1, ..., LQm denote library cells D1, ..., Dm. There can be overlaps amongst C1, ..., Cn and D1, ..., Dm. The internal cell structure (denoted by cloud 302) can be leaf-level cells such as inverters, buffers, flip-flop cells, or even some other IP cells such as serializer/deserializer (SerDes) instances or memory cells. Circuitry 304 is an example of a circuit inside cell structure 302. Circuitry 304 is an inverter (if viewed at cell level) at the transistor level.

As shown in schematic view 400 in FIG. 4, the ECN crosstalk noise analysis model for the CUM 300 illustrated in FIG. 3 includes only the mapping of library cells to CUM ports symbolically. There is no need to duplicate the details of each library cell C1, ..., Dm for the ECN model to be as accurate as the original noise models for cells C1, ..., Dm. However, the resulting ECN model for the CUM 300 is an abstract view of the CUM port noise behavior when considered in the context of hierarchical crosstalk noise analysis. In the actual ECN model used in noise analysis, the schematic view of the CUM ECN model is further reduced to a mapping relationship saved in the ECN model (file), containing library information and self-aligning mapping data structure (SAMDS) information. This mapping relationship is depicted in the following example:

A1 (UDN numerical quantities)
F1 (UDN numerical quantities)
P1 (LC1:A)
...
Pn(LCn:B)
Q1(LQ1:A)
...
Qm(LQm: C)

The references in the above mapping representation of the ECN model are resolved by utilizing a self-aligning mapping data structure built in the ECN model such that all mappings are resolved uniquely when the model is utilized in crosstalk noise analysis.

In one embodiment, the SAMDS is realized by using hash tables (also known as an associative array), where the mapping data is organized by key:value pairs and stored in the hash tables for later retrieval of the value field when a key field is provided. For example, two such hash tables are used in this embodiment. The first hash table establishes the mapping relationship between a leaf-level cell (library cell) that is used in the ECN model, and the library name this leaf-level cell is found in, for all the leaf-level cells used in the ECN model. This structure also makes it possible to uniquely identify the library for a library cell used in the ECN model, so that no conflict exists when the library cell in the ECN model being used needs to be identified uniquely. The second hash table is used to establish the mapping between an instance pin in the design hierarchy of the IP cell to a pin name such that the instance pin can be uniquely identified in the design hierarchy. Without these mappings, it is possible that the correct instance pin may not be uniquely identified in the design, or the library cell used in the ECN model and the library name cannot be mapped uniquely. With these hash tables, both the instance pins in the design hierarchy and the library cells and libraries are aligned (in terms of locating/retrieving the value when given the key) properly and automatically when the ECN model is generated and when it is used in a hierarchical noise analysis.

The following steps demonstrate an example of the first phase of the ECN hierarchical crosstalk noise analysis flow wherein the ECN model is created.

(1) Read in the Verilog or VHDL netlist of the CUM.
(2) Read in the cell libraries that contain the detailed timing, power and functional descriptions of the library cells used in the CUM loaded in step (1).
(3) Resolve all references of library cells used in the CUM by all the library cells processed in step (2). This step establishes the mapping relationship between an instance in the design, a library cell and the library the cell is in. For example, assume there is a library called "ALL_MY_INV_CELLS_s-low_125c_0p81v" that contains all the inverter cells used in a design, and there is an inverter library cell named INVX8, and in the circuit there are 18 (by way of example only) instances of this inverter cell, i.e., Xinv01, Xinv02, . . . , Xinv18. Resolving the reference for these 18 instances of library cell INVX8 means establishing the mapping relationship between the library ALL_MY_INV_CELLS_slow_125c_0p81v, the library cell name (reference cell name) INVX8 and each of the 18 instances Xinv01, . . . , Xinv18.

(4) Identify all input ports of the CUM.
(5) Identify all output port of the CUM.
(6) Identify all bi-directional ports of the CUM.
(7) Identify all CUM ports that are not connected to core library leaf-level library cells.
(8) Identify all feed-through ports of the CUM.
(9) Identify the core library leaf-level library cells that are terminated by ports found in steps (4) to (6).
(10) Create a self-aligning mapping data structure to link each CUM port to the leaf-level library cell it connects to as it is identified in step (9). The self-aligning data structure ensures that the library cell could be located uniquely from all the libraries loaded into an analysis session so the correct mapping can be achieved.

An example implementation of such a data structure in Synopsys PrimeTime-SI® (Synopsys, Inc. of Mountain View, Calif.) command format is as follows:

```
    global lsiEcnRef2CellsA
    global lsiEcnCells2LibA
    global librscale4ecn
    set results(-cell_instance_name) " "
    set results(-use_as_library_cell) 0
    . . .
        set    lsiEcnCells2LibA(BUFX8BV0SI35P)    [get_
            object_name [index_collection [get_libs -of_object
            [index_collection               [get_lib_cells*/
            BUFX8BV0SI35P] 0]] 0]]
    . . .
    set xcn acm_hm
    if {$results(-cell_instance_name) !=" "} {set xcn $results
        (-cell_instance_name)}
    if {$results(-use_as_library_cell)} {
        set xcls [lsort $lsiEcnRef2CellsA($xcn)]
    } else {
        if {[sizeof_collection [get_cells -quiet -exact $xcn]]
            ==0} {
            echo "Error—cannot find instance $xcn while run-
                ning lsiPtsiNoiseECN_acm_hm Aborted."
            return
        } else {
            set xcls [list [get_object_name [get_cells -exact
                $xcn]]]
        }
    }
    foreach xcn $xcls {
        echo -n "Setting noise model data for pins using lsiPtsi-
            NoiseECN_acm_hm for cell instance $xcn . . . "
        if {[sizeof_collection [get_cells -quiet -exact $xcn]]
            ==0} {
        echo "failed—cannot find cell instance $xcn"
        continue
    }
    # No. 1 port: mcm_AWIDM0[3] direction: out cell (block):
        acm_hm
    if {[info exists lsiEcnCells2LibA(TIE0X1MV0SI35P)]} {
        set_noise_lib_pin [get_pins -exact $xcnlmcm_AW-
            IDM0[3]] $lsiEcnCells2LibA(TIE0X1MV0SI35P)/
            TIE0X1MV0SI35P/Z
    } else {
        echo "Error: No library contains reference cell
            TIE0X1MV0SI35P. ECN entry for $xcn/mcm_AW-
            IDM0[3] is skipped."
    }
    # No. 2 port: mcm_AWIDM0[2] direction: out cell (block):
        acm_hm
    if {[info exists lsiEcnCells2LibA(TIE0X1MV0SI35P)]}
        set_noise_lib_pin [get_pins -exact $xcn/mcm_AW-
            IDM0[2]]  $lsiEcnCells2LibA(TIE0X1MV0SI35P)/
            TIE0X1MV0SI35P/Z
    } else {
        echo "Error: No library contains reference cell
            TIE0X1MV0SI35P. ECN entry for $xcn/mcm_AW-
            IDM0[2] is skipped."
    }
```

(11) Assign a numerical value for each of the above low, below high, above high, below low states of the ports, for input port crosstalk noise threshold or output port driving strength quantities for ports found in steps (7) to (8). By way of example only, the methodology uses numerical values of about 0.400 (40% of the power supply value) for inputs and about 1.5000 (1500 ohms) for outputs.

(12) Alternatively, for each of or any of the above low, below high, above high, below low states of the ports, for an input port or an output port, assign a mapping relationship to some library cell for ports found in steps (7) to (8). By way of example only, the ECN generation process can be configured so that the resulting ECN model contains mapping statements such that all the input ports of the IP cell that are not connected directly to some library cell input pin are assigned a mapping relationship to input pin A of the library cell INVX8.

(13) The methods described in steps (11) to (12) can be performed respectively alone or in combination.

(14) Steps (4) to (6) can be performed in any order after steps (1) to (3) but prior to steps (9) to (10). Steps (7) to (8) can be performed in any order after steps (1) to (3) but prior to steps (11) to (12).

(15) The ECN model is created using information gathered in the previous steps for each CUM port, and the model is saved in a text or binary file for subsequent higher-level hierarchical crosstalk noise analysis use. An example of such an ECN model (file) is shown in FIG. 6.

After the ECN model is generated for the CUM, a verification process is used to ensure the correctness of the resulting ECN model. This is the second phase of the ECN model generation methodology mentioned above. In the verification process, a verification wrapper circuit (VWC) is created by creating an instance of the CUM in the verification wrapper circuit, and then attaching a library cell such as a buffer cell to each port of the CUM. The VWC takes into consideration the direction of the CUM ports so that the buffer cells are connected to the CUM ports in a functionally correct way, by connecting the input pin of the buffer cell to the output port of the CUM, and the output pin of the buffer to the input or bidirectional or analog or feed-through of the CUM. Finally, a hierarchical crosstalk noise analysis is performed for the VWC used for ECN model verification, and the analysis result file and messages are examined to make sure no errors exist in the ECN model. The steps for creating the VWC, for performing a hierarchical crosstalk noise analysis session and then examining the resulting information, are as follows:

(1) Create a dedicated circuit as a verification-purpose instantiation Xv of the CUM in the VWC.

(2) Process the library information saved in the CUM ECN model (file), load the libraries needed to prepare for reference resolution in the next step.

(3) Create an instance Xi of library cell LCi and connect the Xi input pin Ai to each of the output pins Xvoi of the Xv cell instance in the VWC.

(4) Connect the rest of the pins of Xi to VWC ports of the matching polarity.

(5) Create an instance Xj of library cell LCj and connect the Xj output pin Zj to each of the input pins Xvij of the Xv cell instance in the VWC.

(6) Connect the rest of the pins of Xj to VWC ports of the matching polarity.

(7) Repeat steps (5) and (6) for each of the bidirectional pins and feed-through pins of Xv cell instance in VWC.

(8) Load the CUM ECN model (file) into the crosstalk noise analysis session.

(9) Utilizing the self-aligning mapping data structure saved in the ECN model (file), uniquely map library cells (LCi, LCj, . . . ) used in the CUM ECN to CUM ports. If a mapping is not possible while processing the VWC for crosstalk noise analysis, an error message is generated to indicate this condition.

(10) Perform a crosstalk noise analysis for the VWC.

(11) Examine the analysis results (if any) and the informational messages generated during the ECN model (file) loading process and the noise analysis process to detect potential errors in the ECN model (file).

(12) If errors are detected during the ECN loading/noise analysis process, the ECN generation procedure is examined and re-executed after the errors are corrected.

Figure 5:
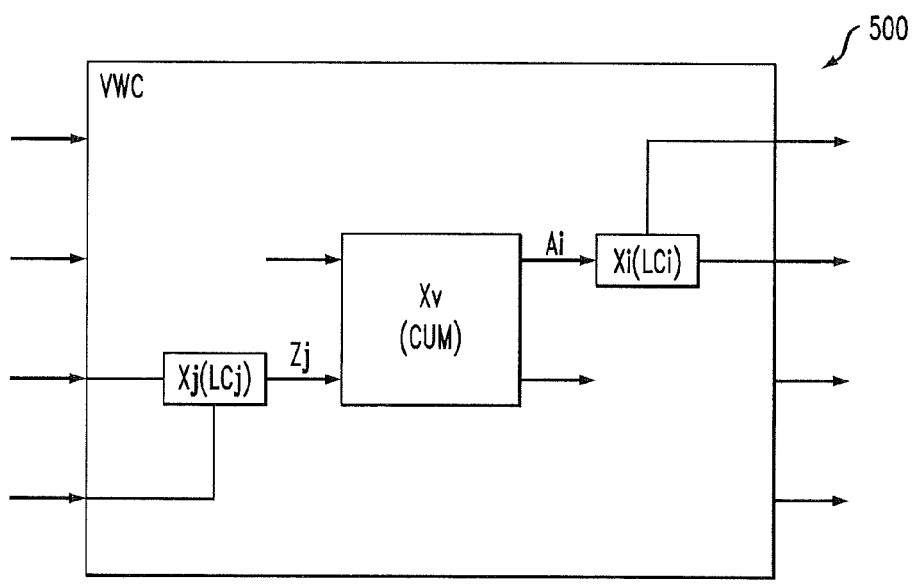
FIG. 5 illustrates a verification wrapper circuit according to an embodiment of the invention.

In FIG. 5, a schematic view 500 of a VWC embodiment is illustrated. Notice that for the sake of simplicity, only one input pin Xvij of Xv (CUM) and only one output pin Xvoi of Xv (CUM) are illustrated fully with connections to library cells LCi and LCj, assuming each has only three pins. The full schematic can be created by following the process used for Xvij and Xvoi.

Using this precise noise modeling technique for IP cell/sub-blocks in a hierarchical integrated circuit design flow, according to embodiments of the invention, the man-power needed to detect and fix false glitch noise violations is reduced, routing resources consumed by noise fixing process are reduced, routing congestion is reduced, and the silicon area used and cell power consumption caused by using oversized cells for noise avoidance are reduced. Further, using precise noise models created using embodiments of the invention for IP cell and sub-blocks in a hierarchical integrated circuit design flow also improves design efficiency by having a highly automated IP cell/sub-block hierarchical noise modeling and verification flow. By formalizing the IP cell model creation, verification and deployment tasks, the IP cell noise model availability is improved and the IP cell noise model quality is enhanced.

FIG. 6 illustrates an equivalent cell noise model (file) 600 according to an embodiment of the invention. The model 600 provides a noise modeling description for each port of a given CUM. In this abbreviated example, it is assumed that a CUM has 1280 ports (while description for only ports 1, 2, 3, 1279 and 1280 is given for the sake of simplicity). However, the model and the CUM may be expressed differently than what is shown in FIG. 6 based on the model language and the circuit description language used in the particular implementation.

As illustratively described herein, embodiments of the invention provide at least the following features. The ECN models are created without using a detailed, circuit-simulation based generation process, by systematically mapping CUM IP cell ports to pre-characterized library cells. The ECN models are generated by utilizing the IP cell/sub-block information of boundary cells that connect the IP cell/sub-block input/output ports to the surrounding designs at a higher level. The ECN models are created for IP cells independent of the top-level integrated circuit using these IP cells. Also, the ECN models contain a self-alignment mapping data structure (SAMDS) that ensures unique and deterministic location of the appropriate detailed data used for crosstalk noise analysis. The ECN model (file) contains library information used in the SAMDS creation and recreation when the ECN model (file) is later used for the CUM in high-level hierarchical crosstalk noise analysis. Still further, the ECN models can be verified by creating a top-level circuit that utilizes all the input/output ports of the IP, without using the top-level circuit that eventually uses the IP cells.

Although embodiments of the invention have been described herein with reference to the accompanying drawings, it is to be understood that embodiments of the invention are not limited to the described embodiments, and that various changes and modifications may be made by one skilled in the art resulting in other embodiments of the invention within the scope of the following claims.

What is claimed is:

1. A method comprising:
generating at least one equivalent cell noise model for a circuit under modeling, wherein the circuit under modeling comprises a plurality of cells useable in an integrated circuit design and the equivalent cell noise model is generated based on each one of the plurality of cells that have connections that terminate at ports of the circuit under modeling; and
utilizing the at least one equivalent cell noise model in a hierarchical crosstalk noise analysis for the integrated circuit design;
wherein the generating and utilizing steps are performed in accordance with at least one processing device.

2. The method of claim 1, wherein the equivalent cell noise model generating step further comprises obtaining a netlist of the circuit under modeling.

3. The method of claim 2, wherein the equivalent cell noise model generating step further comprises obtaining cell library descriptions for the plurality of cells in the circuit under modeling.

4. The method of claim 3, wherein the cell library descriptions comprise one or more timing, power and functional descriptions.

5. The method of claim 3, wherein the equivalent cell noise model generating step further comprises identifying the ports associated with the circuit under modeling.

6. The method of claim 5, wherein the identified ports comprise one or more input ports, output ports, and bi-directional ports of the circuit under modeling.

7. The method of claim 6, wherein the equivalent cell noise model generating step further comprises identifying cells of the plurality of cells that have connections that are terminated at the one or more input ports, output ports, and bi-directional ports of the circuit under modeling.

8. The method of claim 7, wherein the equivalent cell noise model generating step further comprises generating a data structure that maps the identified ports with corresponding ones of the identified cells of the plurality of cells.

9. The method of claim 7, wherein the equivalent cell noise model generating step further comprises assigning numerical values to states of the identified ports.

10. The method of claim 9, wherein the states comprise crosstalk noise threshold states for identified input ports and driving strength quantity states for identified output ports.

11. The method of claim 7, wherein the equivalent cell noise model is generated from information associated with the identified cells of the plurality of cells that are terminated by ports in the circuit under modeling.

12. The method of claim 1, further comprising the step of verifying the equivalent cell noise model.

13. The method of claim 12, wherein the equivalent cell noise model verifying step further comprises generating a verification wrapper circuit corresponding to the circuit under modeling.

14. The method of claim 13, wherein the equivalent cell noise model verifying step further comprises performing the hierarchical crosstalk noise analysis on the verification wrapper circuit.

15. The method of claim 14, wherein the equivalent cell noise model verifying step further comprises modifying the equivalent cell noise model based on results of the hierarchical crosstalk noise analysis performed on the verification wrapper circuit.

16. A computer program product comprising non-transitory computer-readable storage medium having computer program code embodied therein for use in designing an integrated circuit, wherein the computer program code when executed in an integrated circuit design system causes the integrated circuit design system to perform the steps of claim 1.

17. An integrated circuit designed in accordance with the steps of claim 1.

18. An apparatus comprising:
a memory; and
a processing device operatively coupled to the memory and configured to:
generate at least one equivalent cell noise model for a circuit under modeling, wherein the circuit under modeling comprises a plurality of cells useable in an integrated circuit design and the equivalent cell noise model is generated based on each one of the plurality of cells that have connections that terminate at ports of the circuit under modeling; and
utilize the at least one equivalent cell noise model in a hierarchical crosstalk noise analysis for the integrated circuit design.

19. The apparatus of claim 18, wherein the equivalent cell noise model is generated from information associated with the cells of the plurality of cells that are terminated by the ports in the circuit under modeling.

20. The apparatus of claim 18, wherein the processing device is further configured to verify the equivalent cell noise model by generating a verification wrapper circuit corresponding to the circuit under modeling.

* * * * *

UNITED STATES PATENT AND TRADEMARK OFFICE
CERTIFICATE OF CORRECTION

PATENT NO. : 8,719,752 B1  
APPLICATION NO. : 13/746954  
DATED : May 6, 2014  
INVENTOR(S) : Lun Ye et al.

Page 1 of 1

It is certified that error appears in the above-identified patent and that said Letters Patent is hereby corrected as shown below:

In the Specification

Col. 9, line 65, please delete "$xcnlmcm" and replace with --$xcn/mcm--

Col. 10, line 8, after "(TIE0X1MV0SI35P)]}" please insert --{--

Signed and Sealed this  
Fifteenth Day of July, 2014

Michelle K. Lee  
*Deputy Director of the United States Patent and Trademark Office*